United States Patent [19]

Ueda

[11] Patent Number: 4,945,513

[45] Date of Patent: Jul. 31, 1990

[54] GATE ARRAY DEVICE

[75] Inventor: Masahiro Ueda, Hyogo, Japan

[73] Assignee: Mitsubishi Denki Kabushiki Kaisha, Tokyo, Japan

[21] Appl. No.: 258,592

[22] Filed: Oct. 17, 1988

[30] Foreign Application Priority Data

Oct. 19, 1987 [JP] Japan .................... 62-264577

[51] Int. Cl.$^5$ .............................. G11C 5/10
[52] U.S. Cl. ............................ 365/51; 365/63; 365/189.08
[58] Field of Search ............... 365/51, 63, 230.03, 365/230.06, 189.08

[56] References Cited

U.S. PATENT DOCUMENTS 4,562,453 12/1985 Noguchi et al. .................. 357/44
4,791,607 12/1988 Igarashi et al. .................. 365/51

OTHER PUBLICATIONS

Toshi Sano et al., "A 20ns CMOS Functional Gate Array with a Configurable Memory", 1983 IEEE International Solid-State Circuits Conference, pp. 146–147.
H. Tago et al., "A CMOS Gate Array with Easily Testable Three Port RAMs", 1984 IEEE (ICCD 1984), pp. 424–427.
Isao Ohkura et al., "A CMOS Gate Array for Computer Applications", 1983 IEEE (ICCD 1983), pp. 268–271.
Tomoku Takada, Haruyuki Tago, Masasumi Shiochi, "A CMOS Gate Array with RAMs", 1984 International Solid-State Device Conference (SSD 84–59), pp. 23–28.
Bowers, Stephen Glen, "CMOS Dual Port RAM Masterslice", IEEE 1982, (1982) CICC), pp. 311–314.

Primary Examiner—Joseph A. Popek
Attorney, Agent, or Firm—Lowe, Price, LeBlanc, Becker & Shur

[57] ABSTRACT

A gate array device having an independent memory array region is disclosed. Only memory cells are disposed in the memory array region. Peripheral circuits for accessing the memory arrays such as an address decoder, sense amplifier and address buffer are formed of basic cells in a basic cell region. The unique arrangement of the gate array device permits a flexible selection of word and bit length of the memory array and an effective use of the memory array region.

6 Claims, 9 Drawing Sheets

GATE ARRAY DEVICE

BACKGROUND OF THE INTENTION

1. Field of the Invention

This invention relates generally to a gate array device, and in particular to a gate array device with an independent memory array region.

2. Description of the Prior Art

In FIG. 1, there is illustrated in block diagram the master chip pattern of a typical prior-art gate array with a memory array region. This type of the gate array is described, for example, in Digest of Technical Papers presented in 1983 International Solid-State Circuits Conference pp. 146–147, and in an article entitled "A CMOS Gate Array with Easily Testable Three Port RAMs" released by IEEE in 1984 (ICCD 1984).

As shown in FIG. 1, the gate array includes I/O buffer regions 1 where a plurality of I/O buffers for input and output signals are provided. The gate array also includes a basic cell region 2 and a memory array region 3. In the basic cell region 2, a number of basic cells BC are arranged in a plurality of rows 21, while in the memory array region 3, a plurality of memory arrays 35–38 and the associated peripheral circuits 31–34 are provided.

The basic cell BC of FIG. 1 comprises a pair of P-channel MOSFET and a N-channel MOSFET and is disclosed in detail, for example, in U.S. Pat. No. 4,562,453 issued to Noguchi et al. in Dec. 31, 1985.

FIG. 2 shows in functional block diagram the arrangement of the memory arrays 35–38 and the associated peripheral circuits 31–34 in the memory array region 3. Provided in the memory array region 3 are a plurality of memory cells MC arranged in arrays 35–38 for the storage of data signals. Also provided in the memory array region 3 are address buffers 31a–34a to be supplied with address signals for designating the memory cells MC; row decoders 31b–34b for decoding the address signals; and sense amplifiers 31c–34c for amplifying the data signal which has been stored in the memory cell MC designated by the address signal. Memory cells in memory cell arrays 35–38 are connected to word lines WL0–WL63 and thirty two pairs of bit lines BL and $\overline{BL}$. The row decoders 31b–34b operate to select any one of the word lines WL0–WL63 in response to a 6-bit address signal.

Because the memory region 3 is fabricated through a master process (where transistors for the gate arrays are formed), it is a common practice to design and manufacture the memory region with a maximum possible memory capacity. By way of example the memory region may be formed as a RAM having a word length of 64 words and a bit length of 32 bits in anticipation of a user's demand. In the arrangement of FIG. 2, the memory region 3 of the storage capacity of 64 word×32 bit are divided into four memory arrays 35–38, each having a storage capacity 64 word×8 bit for the convenience of practical application.

This configuration of the memory region 3 with four arrays 35–38 of the stated storage capacities makes it possible for the user to design and arrange the memory arrays into RAMs with the storage capacity of, for example, 64 word×32 bit, 64 word×24 bit, 64 word×16 bit or 64×8 bit.

However, it is impossible to incorporate these memory arrays into a RAM having a storage capacity greater than 65 word×32 bit, such as a 128 word×16 bit or 32 word×65 bit configuration. This is due to the fact that the address buffer 31a, row decoder 31b and sense amplifier 31c are designed to be the peripheral circuits for the memory array 35 having a maximum fixed storage capacity of 64 word×32 bit. In order to avoid this inconvenience, it is necessary to provide in advance peripheral circuits compatible with a memory array of a greater storage capacity. When this is done and a memory array of a smaller storage capacity is subsequently needed and implemented, some peripheral circuits are left unused as redundancies. In addition, if it is desired to use the memory array 38 as a RAM with a storage capacity of 65 word×8 bit, the remaining memory cells in the arrays 38 and associated peripheral circuits for accessing them are rendered superfluous.

A prior-art construction of interest to this invention is disclosed in the aforementioned U.S. Pat. No. 4,562,453 which teaches making up all of the circuits in the memory array including the gate array of basic cells. A similar disclosure is found in a paper of IEEE entitled "A CMOS Gate Array for Computer Applications" (ICCD 1983).

Another prior art construction of interest to this invention is disclosed in a paper entitled "A CMOS GATE ARRAY with RAMs" presented in 1984 International Solid-State Device Conference (SSD 84–59).

Still another prior art construction of interest to this invention is disclosed in a paper entitled "CMOS Dual Port RAM Masterslice" which was released by IEEE in 1982 (1982 CICC). The paper describes a gate array part of which is composed of RAMs.

SUMMARY OF THE INVENTION

It is an object of the invention to provide a gate array in which the word and bit lengths of a memory array can be selected as desired.

It is another object of the invention to provide a gate array in which a memory array region is effectively utilized.

It is still another object of the invention to provide a gate array in which the circuit for accessing a memory array is made up of basic cells.

It is still another object of the invention to provide a gate array in which an address decoder, sense amplifier and address buffer are made up of basic cells.

Briefly stated, a gate array device constructed according to the invention comprises a memory array region where a plurality of memory cells are formed, an input/output buffer region for a data and address signals, and a basic cell region composed of a plurality of basic cells. The gate array device also includes an access circuit comprised of basic cells for accessing the memory array in the basic cell region. With the access circuit being composed of basic cells, it is possible to select as desired or required the word and bit lengths for the accessed memory array. In addition, the memory array region is effectively as well as efficiently utilized.

In a preferred embodiment, the access circuit comprises an address decoder made up of basic cells, a sense amplifier and an address buffer.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
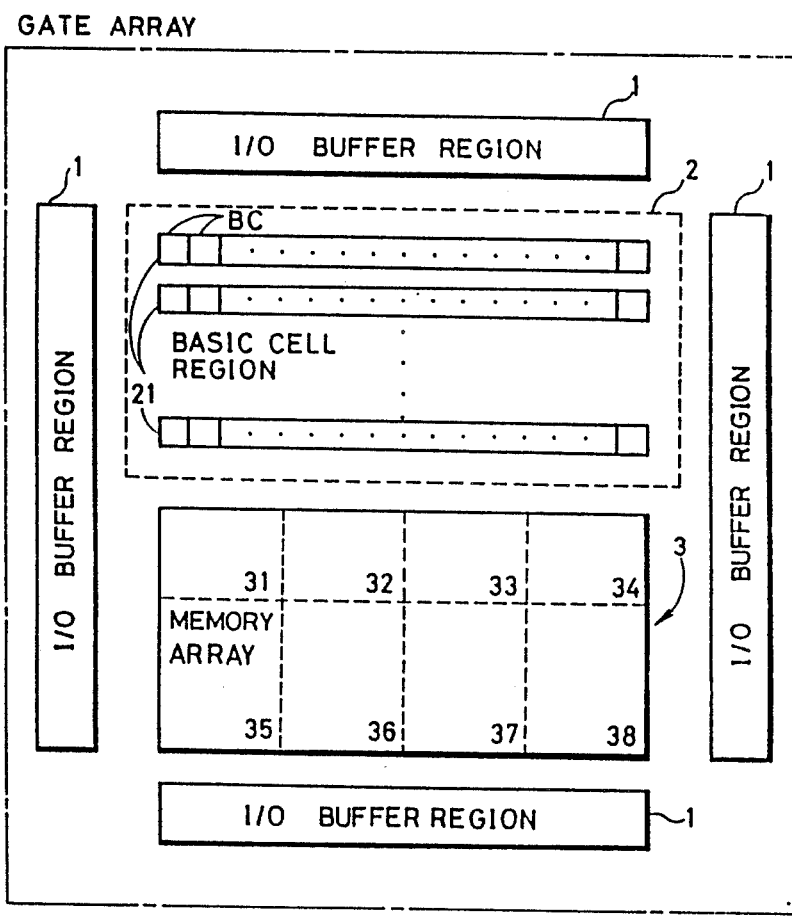
FIG. 1 is a block diagram showing a pattern configuration of a master chip for a typical prior-art gate array.
Figure 2:
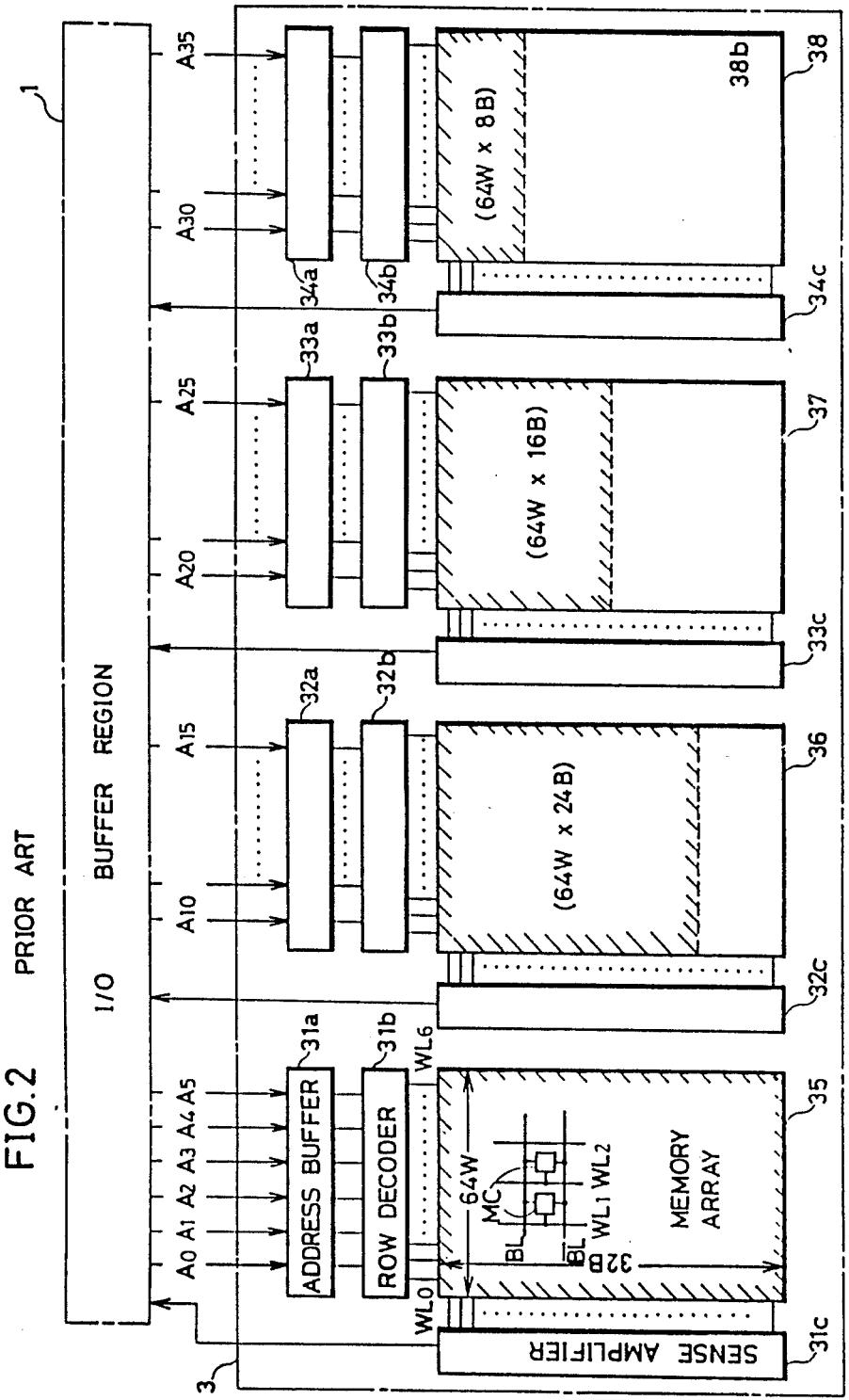
FIG. 2 is a functional block diagram showing arrangement of circuits provided in the memory array region of FIG. 1.
Figure 3:
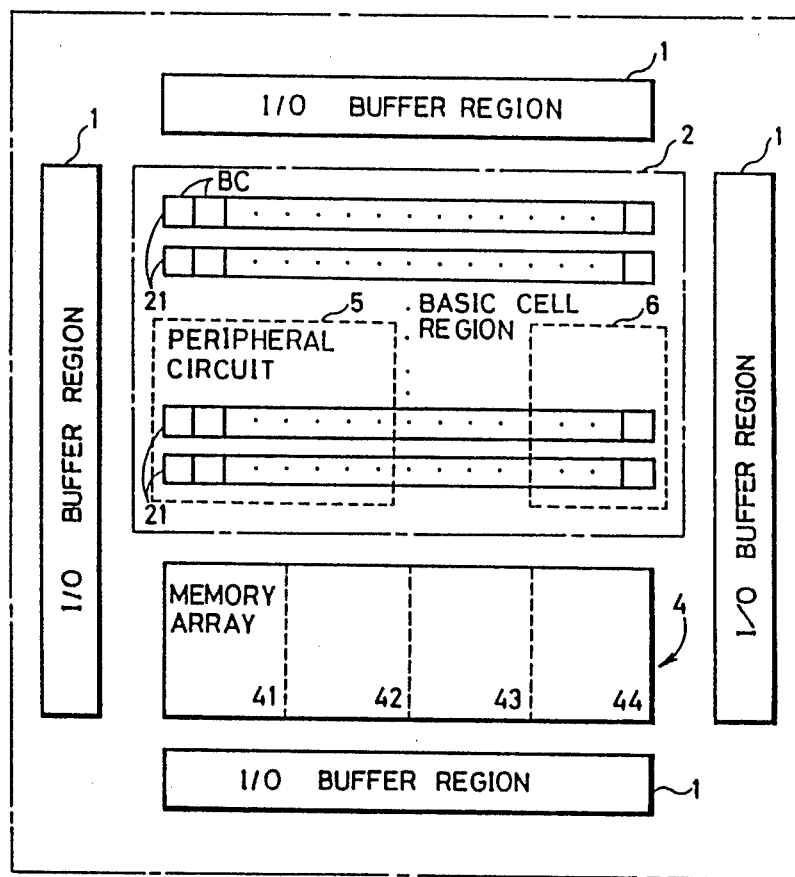
FIG. 3 is a block diagram showing a pattern configuration of a master chip for a gate array device according to a preferred embodiment of the invention.

In FIG. 3, there is schematically illustrated a master chip of a gate array according to one embodiment of the invention. The gate array has four memory arrays 41–44 formed exclusively in a memory array region 4. Peripheral circuits 5 and 6 are formed of basic cells BC in a basic cell region 2. The other components and their construction and arrangement are identical to those shown in FIG. 1.

Figure 4:
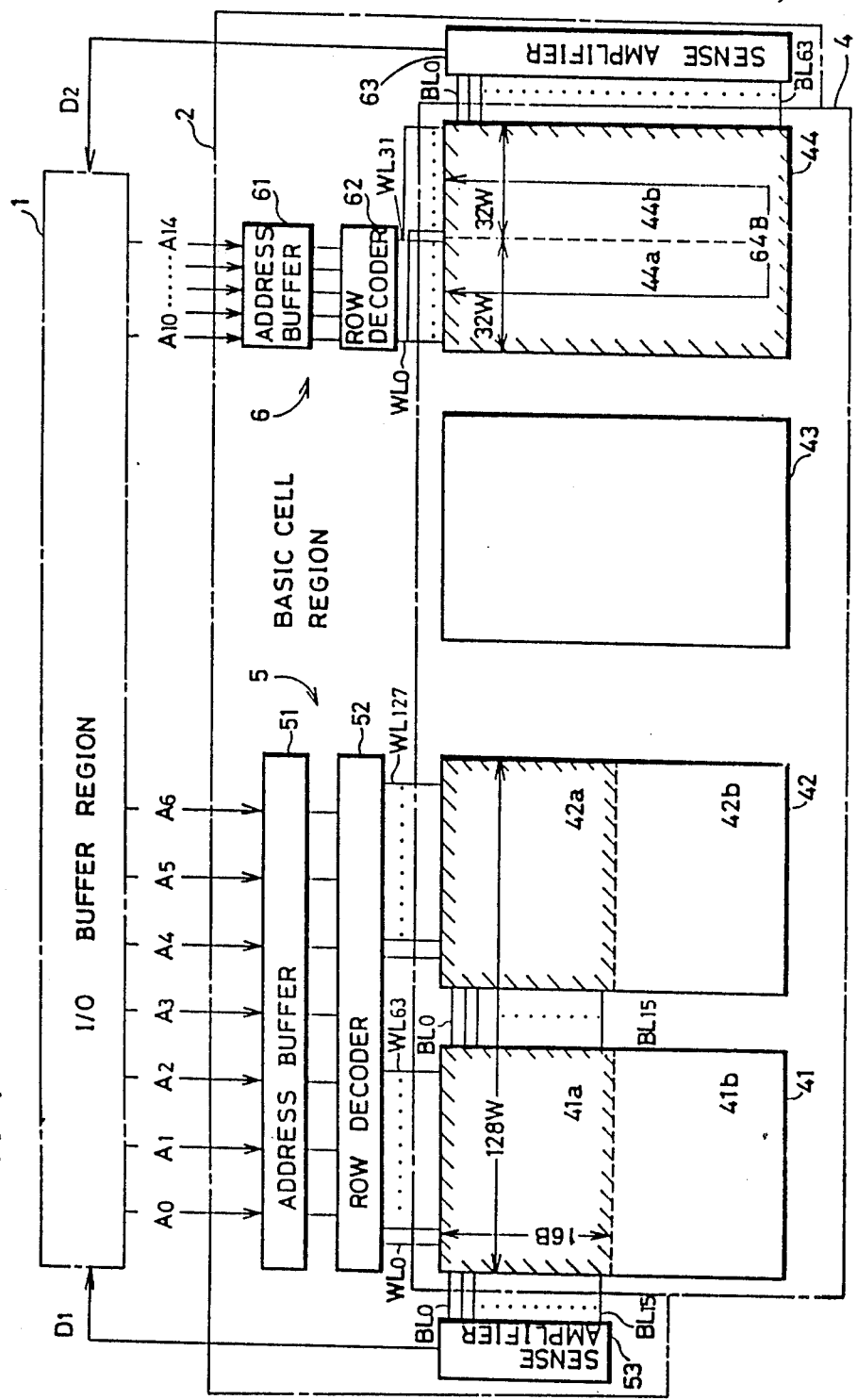
FIG. 4 is a functional block diagram showing memory arrays formed in the memory array region and peripheral circuits formed in the basic cell region of FIG. 3.

The memory arrays 41–44 formed in the memory region 4 and the peripheral circuitries 5 and 6 provided in the basic cell region 2 are shown in functional block diagram in FIG. 4. Two different peripheral circuitries 5 and 6 are illustrated for accessing the memory arrays 41–44. One peripheral circuitry 5 comprises an address buffer 51, a row decoder 52 and a sense amplifier 53, all of which are formed in the basic cell region 2. The peripheral circuit 5 is for a RAM of 128 word × 16 bit configuration composed of memory array sections 41a and 42b in memory arrays 41 and 42, respectively. The address buffer 51 is designed to deal with 7-bit address signals $A_0$–$A_6$. The row decoder 52 operates to decode the address signals $A_0$–$A_6$ to select any one of word lines WL0–WL127. The sense amplifier 53 is connected to the memory arrays 41 and 42 through 16 bit line pairs BL0–BL15. Similarly, the memory arrays 41 and 42 are interconnected by bit line pairs BL0–BL15.

With this arrangement where peripheral circuits 51, 52 and 53 are provided in the basic cell region 2, a RAM with a storage capacity of 128 word × 16 bit is realized. The remaining sections 41b and 42b in the memory arrays 41 and 42 are left unaddressed. These memory sections 41b and 42b may be used as a RAM by forming different peripheral circuits of basic cells in the basic cell region for the memory cells in the remaining sections 41b and 42b.

A second peripheral circuitry 6 is made up of an address buffer 61, a row decoder 62 and a sense amplifier 63, all provided in the basic cell region 2. The peripheral circuitry 6 is for implementing a RAM of 32 word × 64 bit configuration with the memory array 44. Thus, the address buffer 61 is designed to deal with 5-bit address signals $A_0$–$A_{14}$. The row decoder 62 operates to decode the address signals $A_0$–$A_{14}$ to select one of the 32 word lines WL0–WL31. The memory array 44 is divided into two array sections 44a and 44b, and word lines WL0–WL31 are parallel connected to each of the array sections 44a and 44b. Connected also to the array sections 44a and 44b through 64 bit lines pairs BL0–BL63 is a sense amplifier 63.

By forming the peripheral circuitry with basic cells in the basic cell region 2, a 32 word × 64 bit RAM is realized.

Figure 5:
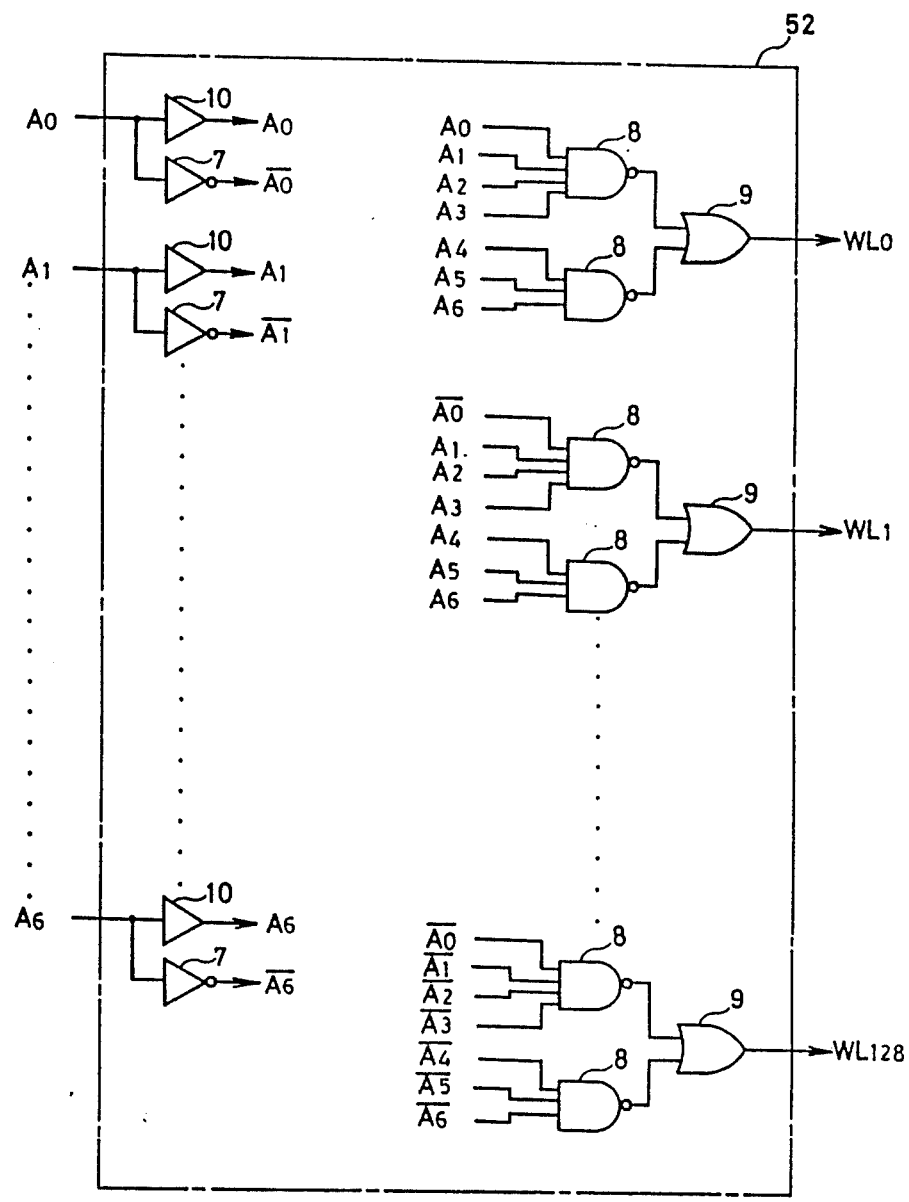
FIG. 5 is a circuit diagram of a row decoder formed in the basic cell region of FIG. 4.

As shown in the circuit diagram of FIG. 5, the row decoder 52 formed in the basic cell region 2 of FIG. 4 comprises seven inverters 7, fourteen NAND gates 8, seven OR gates 9 and seven buffers 10.

Figure 6A:
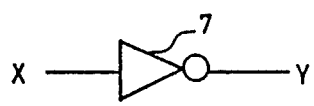
FIG. 6A is a graphic symbol of the inverter employed in the row decoder of FIG. 4.
Figure 6B:
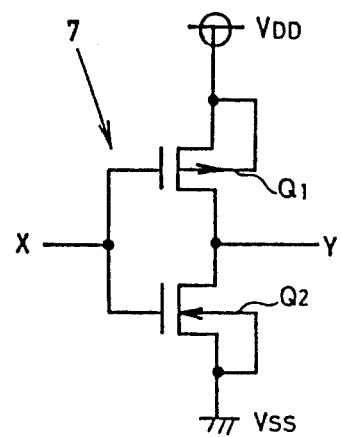
FIG. 6B is a circuit diagram of the inverter shown in FIG. 6A.

FIG. 6A shows a graphic symbol for the inverters 7 employed in the decoder 52 of FIG. 5, and FIG. 6B illustrates the circuit configuration of the inverter 7. As shown, the inverter 7 comprises a P-channel MOSFET Q1 and a N-channel MOSFET Q2 and is series connected between a voltage source $V_{DD}$ and ground $V_{SS}$.

Figure 6C:
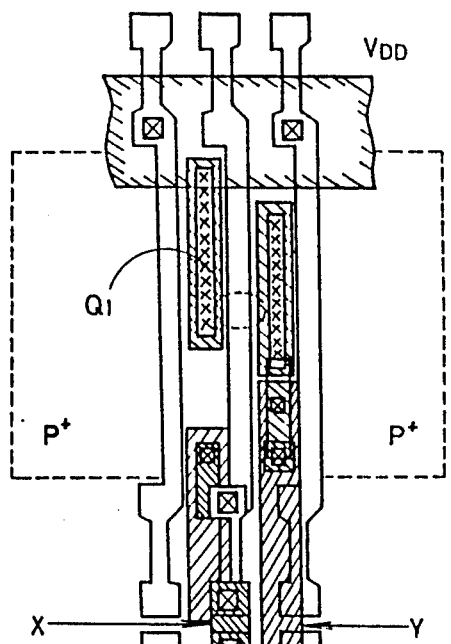
FIG. 6C is a schematic illustration showing a pattern configuration of a master chip for the inverter formed in the basic cell region of FIG. 3.
Figure 6D:
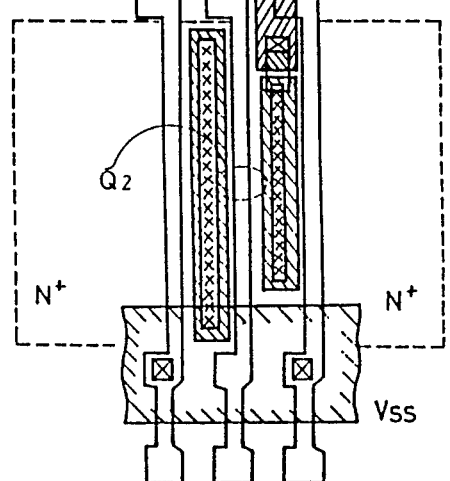
FIG. 6D are graphic symbols for indicating several component parts of the inverter shown in FIG. 6C.

FIG. 6C shows the configuration of a master chip for the inverter 7 which is formed by interconnecting the basic cells. As shown, a P-channel MOSFET Q1 is produced in a P+ impurity region of a semiconductor substrate while in an N+ impurity region a N-channel MOSFET is created. FETs Q1 and Q2 form one basic cell. The FETs Q1 and Q2 are interconnected by first and second aluminum interconnection layers and via contact holes or through holes to form the inverter (refer to graphic symbols shown in FIG. 6D).

Figure 7A:
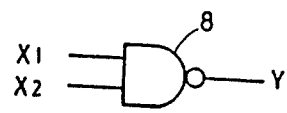
FIG. 7A is a graphic symbol of a NAND gate employed in the row decoder of FIG. 4.
Figure 7B:
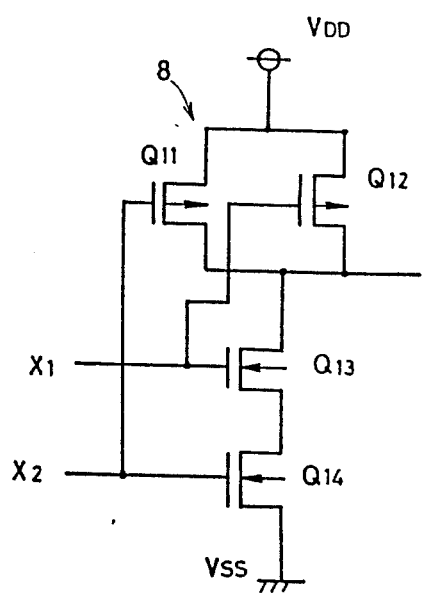
FIG. 7B is a circuit diagram of the NAND gate of FIG. 6A.
Figure 7C:
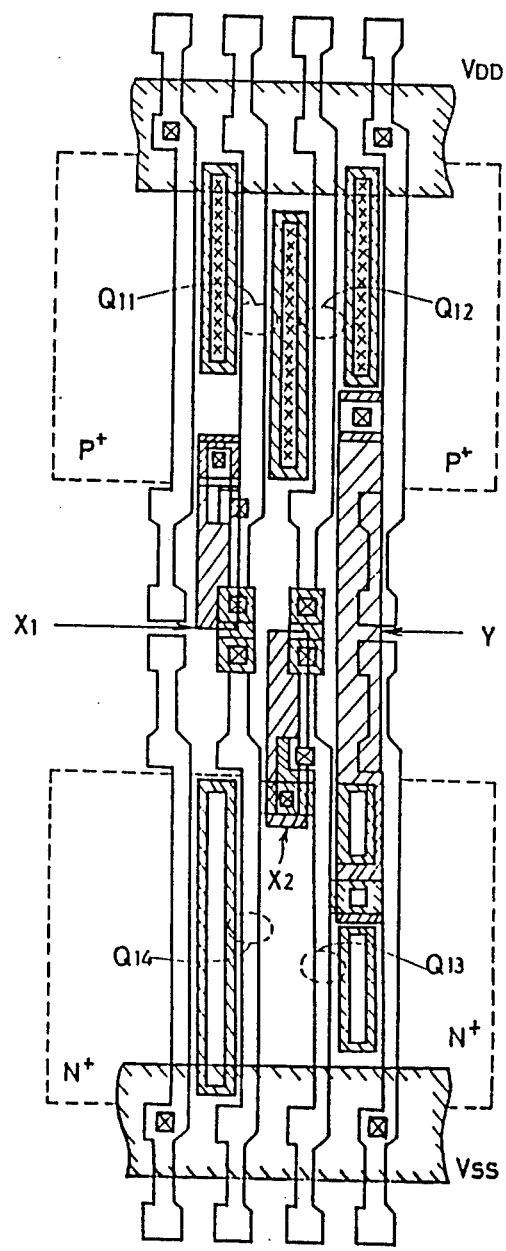
FIG. 7C is a schematic illustration showing a pattern configuration of a master chip for the NAND gate formed in the basic cell region of FIG. 3.

FIGS. 7A–7C illustrate the NAND gates employed in the decoder 52 of FIG. 5. Thus, FIG. 7A is a graphic symbol of the NAND gate 8, and FIG. 7B shows the circuit configuration of the NAND gate 8. For convenience and simplicity a NAND gate circuit having two inputs is illustrated. FIG. 7C shows a pattern configuration of a master chip for the NAND gate formed by interconnecting basic cells.

Figure 8:
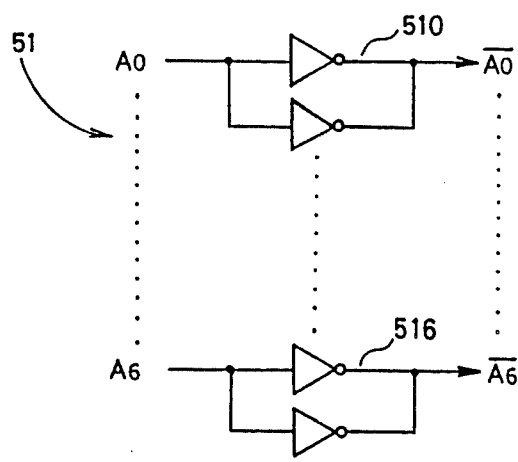
FIG. 8 is a diagram of the address buffer formed in the basic cell region of FIG. 4.

In FIG. 8, there is illustrated an address buffer 51 to be provided in the basic cell region of FIG. 4. The address buffer 51 comprises seven buffers 510–516 which are connected to be supplied with address signals $A_0$–$A_6$. Each of the buffers 510–516 comprises a pair of parallel connected inverters. The inverter is formed by interconnecting basic cells as shown in FIG. 6C.

Figure 9A:
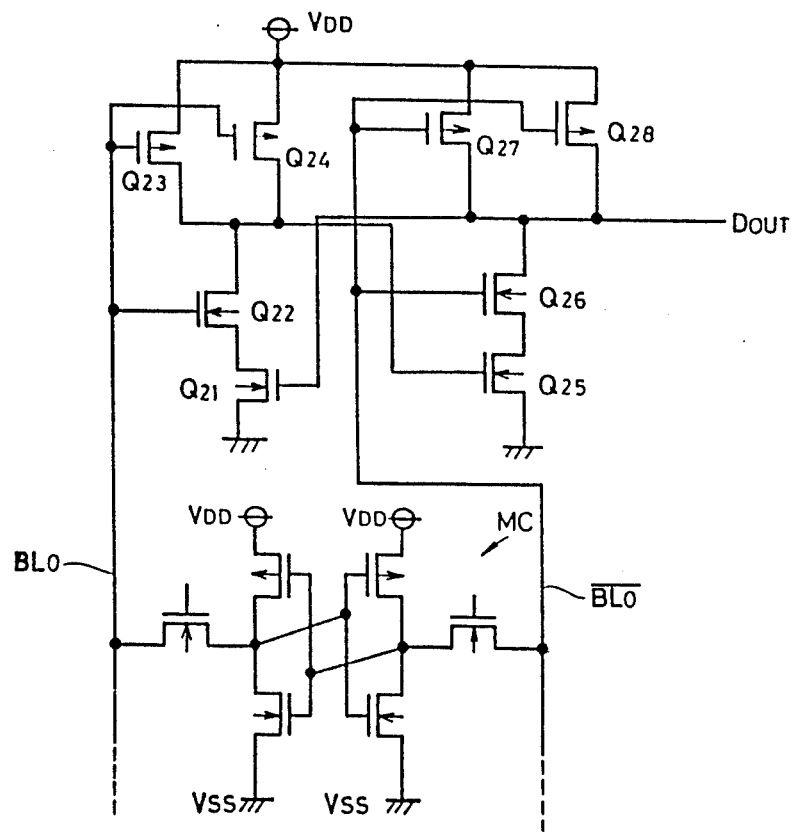
FIG. 9A is a circuit diagram of one of the sense amplifiers provided in the basic cell region of FIG. 4.

Shown in FIG. 9A is the circuit configuration of the sense amplifier 53 provided in the basic cell region of FIG. 4 together with one memory cell MC. The sense amplifier comprises P-channel MOSFET Q23, Q24, Q27, Q28 and N-channel MOSFET Q21, Q22, Q25, Q26.

Figure 9B:
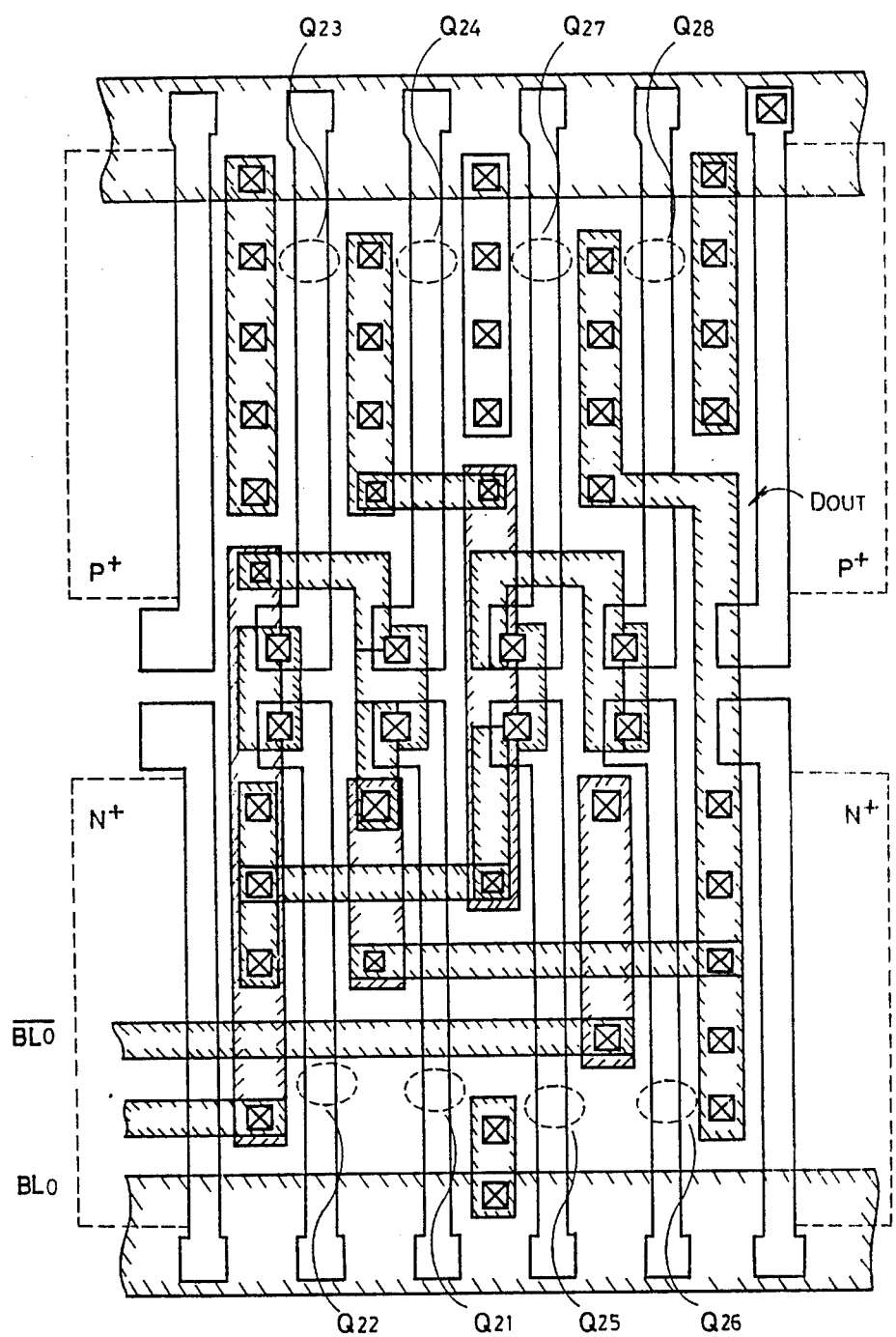
FIG. 9B is a schematic illustration showing a pattern configuration of a masterchip for the circuit of the sense amplifier shown in FIG. 3.

In FIG. 9B, there is illustrated a pattern configuration of the master chip for the sense amplifier of FIG. 9A which is formed by interconnecting the basic cells. MOSFETs Q21–Q28 for forming one sense amplifier are shown.

As can be understood from the foregoing description, the construction of the address buffers 51 and 61, the row decoders 52 and 62, and the sense amplifiers 53 and 63 with basic cells as shown in FIG. 4 leads to efficient as well as effective use of the memory array region in the gate array. Moreover, it makes it possible to optionally select the word and bit lengths of the memory array as required.

In the illustrated embodiment, the address buffers 51 and 56, the row decoders 52 and 62, and the sense amplifier 53 and 63 are presented as peripheral circuits. However, the peripheral circuit is not limited to these elements. For example, according to the invention, circuits accessing the memory array may be suitably formed of basic cells in the basic cell region. Consequently, a gate array which permits a flexible selection of the word and bit lengths of the memory array as well as an efficient and effective use of the memory array region.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A gate array device comprising:
   a memory array region comprising a plurality of memory cells for storing data signals;
   an input-output buffer means region for transferring to and from said memory cells said data signals and address signals for designating said memory cells;
   a basic cell region including a plurality of basic cells each comprising a first field effect device of one conductive type and a second field effect device of the opposite conductive type;
   access means comprising and plurality of basic cells in said basic cell region for accessing said memory cells in response to said address signals, said access means being connected between said input-output buffer means and said memory cells.

2. A gate array device according to claim 1 wherein said access means comprises decoder means connected to be supplied with said address signals from said input-output buffer means for decoding said address signals, and
   memory cells in said memory cell array are designated by the signals decoded by said decoder means.

3. A gate array device according to claim 2 wherein said access means further comprises address buffer means connected between said input-output buffer means and said decoder means to receive address signals from said input-output buffer means.

4. A gate array device according to claim 3 wherein said decoder means comprises NAND gate means connected to receive said address signals from said address buffer means.

5. A gate array device according to claim 1 wherein said access means comprises sense amplifier means connected to be supplied with data signals from the memory cells in said memory array for amplifying data signals stored in said memory cells.

6. A gate array device according to claim 1 wherein said one conductive type is P-channel and said opposite conductive type is N-channel.

* * * * *